: US005930133A

United States Patent [19]
Morizuka

[11] Patent Number: 5,930,133
[45] Date of Patent: Jul. 27, 1999

[54] RECTIFYING DEVICE FOR ACHIEVING A HIGH POWER EFFICIENCY

[75] Inventor: Kouhei Morizuka, Kawasaki, Japan

[73] Assignee: Kabushiki Kaisha Toshiba, Kawasaki, Japan

[21] Appl. No.: 09/048,849

[22] Filed: Mar. 27, 1998

[30] Foreign Application Priority Data

Mar. 28, 1997 [JP] Japan .................................. 9-077094

[51] Int. Cl.⁶ .................................................. H02M 7/06
[52] U.S. Cl. .......................................... 363/126; 323/229
[58] Field of Search .................................... 363/125, 126, 363/52; 323/229

[56] References Cited

U.S. PATENT DOCUMENTS 3,983,417  9/1976  Rheinfelder ............................ 307/261
5,099,191  3/1992  Galler et al. ........................ 323/229 X

OTHER PUBLICATIONS

S. Eng, "Low–Noise Properties of Microwave Backward Diodes", IRE Transactions on Microwave Theory and Techniques, MTT–8, (Sep., 1961), pp. 419–425.

S. Nakamura, et al., "High–Power GaN P–N Junction Blue–Light–Emitting Diodes", Japanese Journal of Applied Physics, vol. 30 No. 12A, pp. L1998–L2001, (Dec. 1991).

M. Ruff et. al., "SiC Devices: Physics and Numerical Simulation", IEEE Transactions on Electron Devices, vol. 41 No. 6, pp. 1040–1054, (Jun. 1994).

Primary Examiner—Robert E. Nappi
Assistant Examiner—Y. J. Han
Attorney, Agent, or Firm—Oblon, Spivak, McClelland, Maier & Neustadt, P.C.

[57] ABSTRACT

A tunnel diode is used as a rectifying device. The tunnel diode is so implemented as to suppress a flow of a current relative to an applied forward voltage of AC which is greater than a voltage at a peak value of a tunnel current. Stated in another word, use is made of a semiconductor of a wide forbidden band width so as to enable the forward turn-on voltage of the diode to be made greater than a maximum value of the applied voltage. Upon application of a reverse voltage to the diode, on the other hand, a greater tunnel current flows from a zero bias time. By connecting the tunnel diode, unlike an ordinary diode, in a reverse-bias fashion in the rectifying circuit, it is possible to realize a rectifying device whose turn-on voltage is zero and to prevent less rectifying efficiency at a power supply circuit of low voltage.

8 Claims, 3 Drawing Sheets

RECTIFYING DEVICE FOR ACHIEVING A HIGH POWER EFFICIENCY

BACKGROUND OF THE INVENTION

1. Field of the Invention

The present invention relates to a rectifying device used in, for example, a DC/AC converting circuit.

2. Discussion of the Background

Attempts have been made to achieve a high-speed MOS transistor through the miniaturization of the gate length. In recent years, however, the reduction of the gate length to a submicron level has been achieved. This involves an increase in a channel field strength and a trapping of electrons and holes in the gate oxide film, presenting an operation error problem.

In order to avoid such a problem, attempts have been made to lower the power supply voltage. Conventionally, the integrated circuit using MOSFETs has been driven at a power supply voltage of 5V. However, there has emerged an integrated circuit operating at a power supply voltage of 3.5V with a gate length of 0.35 micron currently achieved. This trend is further continuing into the future and, if a gate length of below 0.2 micron is achieved, it will be necessary to lower the power supply voltage to about 2V.

For those apparatuses using such an integrated circuit or circuits it has been necessary to be equipped with a corresponding DC power supply. As such a DC power supply use is usually made of a switching regulator. However, the power loss by a rectifying device presents a problem because a power supply voltage involved is lowered.

That is, for a usual silicon pn-junction diode it is necessary to apply a voltage of the order of 0.6V at a time of conduction. With a DC power supply of 2V, however, as large as 23% loss is caused due to the diode. It is thus desirable to use a diode adapted to be turned ON at a lower voltage level. Even if a schottky diode is used, there unavoidably occurs a forward voltage drop of about 0.4V. As a result, less power efficiency results from a forward voltage drop of the diode and a serious consequence is involved.

A forward voltage drop across the diode is usually substantially proportional to the forbidden band of a semiconductor and, using a semiconductor of a narrower forbidden band width, can be lowered. The narrower forbidden band width deteriorates the backward withstand voltage and temperature characteristic, so that, usually, use is never made of any semiconductor having a narrower forbidden band width than the forbidden band width of silicon (=1.1 eV). For this reason, less power efficiency of a power supply circuit is unavoidable against an integrated circuit having a power supply voltage of about 2V in particular.

As set out above, with the conventional rectifying device, the power loss by the forward voltage drop is unavoidable and the efficiency is extremely reduced at a low power supply voltage of below about 2V in particular.

BRIEF SUMMARY OF THE INVENTION

Accordingly, it is an object of the present invention to provide a rectifying device having an excellent power efficiency even at a lower power supply voltage.

According to one aspect of the present invention, there is provided a rectifying device comprising: a pair of terminals across which a predetermined AC voltage is applied; and a tunnel diode, connected between the pair of terminals, for performing a rectifying function, wherein a voltage giving a peak value of a tunnel current flowing upon application of a forward bias to the tunnel diode is smaller than a maximum value of the AC voltage.

According to another aspect of the present invention, there is provided a rectifying device comprising: a pair of terminals across which a predetermined AC voltage is applied; and a tunnel diode, connected between the pair of terminals, for performing a rectifying function, wherein a forward turn-on voltage of the tunnel diode is greater than a maximum value of the AC voltage.

According to another aspect of the present invention, there is provided a rectifying circuit comprising: a circuit for supplying a predetermined AC voltage; and a tunnel diode for receiving the AC voltage and performing a rectifying function, wherein a voltage giving a peak value of a tunnel current flowing upon application of a forward bias to the tunnel diode is smaller than a maximum value of the AC voltage.

According to another aspect of the present invention, there is provided a rectifying circuit comprising: a circuit for supplying a predetermined AC voltage; and a tunnel diode for receiving the AC voltage and performing a rectifying function, wherein a forward turn-on voltage of the tunnel diode is greater than a maximum value of the AC voltage.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Figure 1:
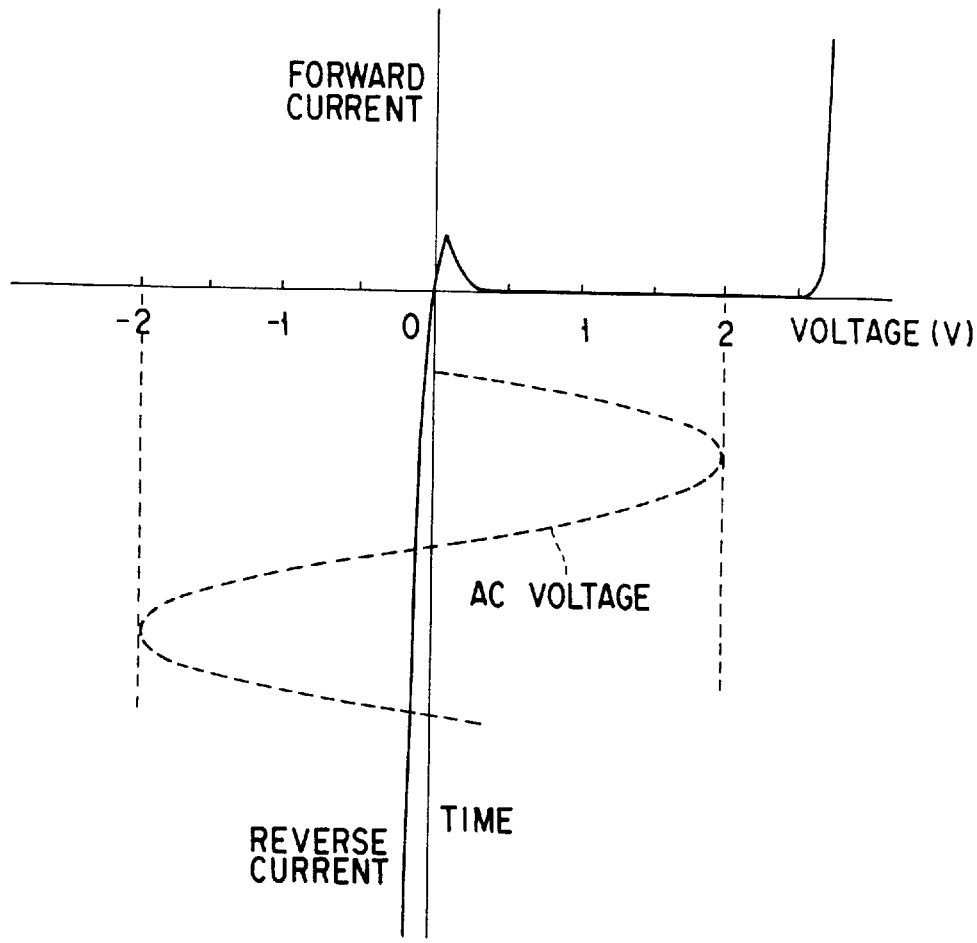
FIG. 1 is a view showing the characteristic of a rectifying device according to the present invention.

One embodiment of the present invention will be explained below with reference to the drawing.

Figure 2:
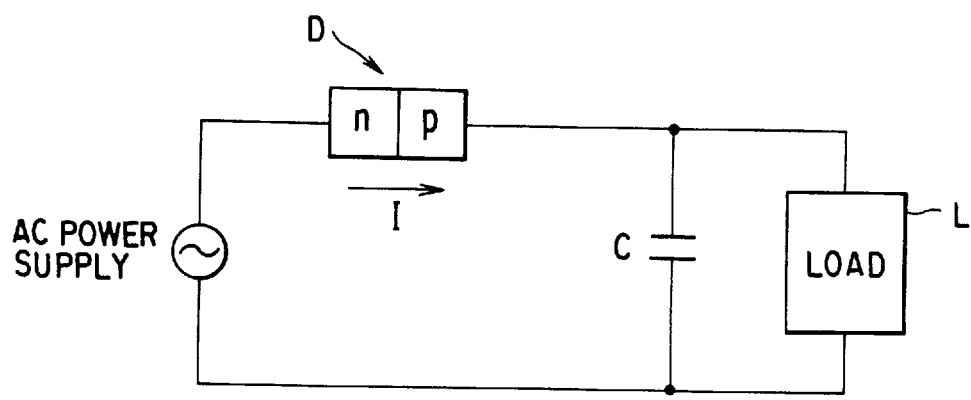
FIG. 2 is a schematic view showing a practical circuit to which the rectifying device is applied.

According to the present invention, a tunnel diode having the characteristic as shown in FIG. 1 is used as a rectifying device. The tunnel diode is so implemented as to suppress a flow of a current relative to an applied forward voltage of AC which is greater than a voltage at a peak value of a tunnel current. Stated another way, use is made of a semiconductor of a wide forbidden band width so as to enable the forward turn-on voltage of the diode to be made greater than a maximum value of the applied voltage. Upon application of a reverse voltage to the diode, on the other hand, a greater tunnel current flows from a zero bias time. By connecting the tunnel diode, unlike an ordinary diode, in a reverse-bias fashion in the rectifying circuit as shown in FIG. 2, it is possible to realize a rectifying device whose turn-on voltage is zero and to prevent less rectifying efficiency at a power supply circuit of low voltage.

Figure 3:
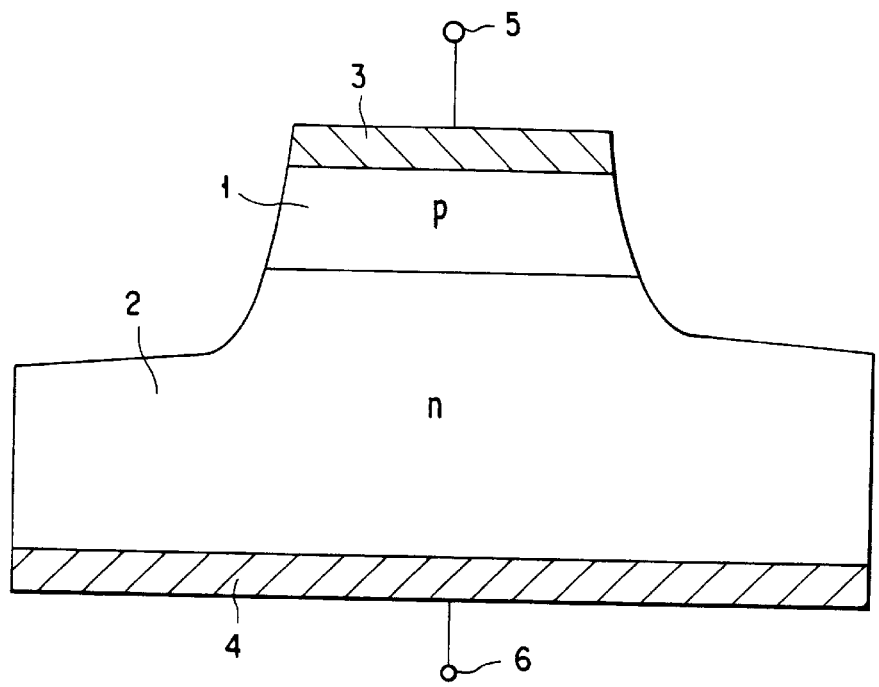
FIG. 3 is a cross-sectional view showing a structure of a rectifying device according to one embodiment of the present invention.

In the present embodiment as will be set out below, an explanation will be given below about an example of a tunnel diode using a semiconductor of an α-SiC (hexagonal crystal structure). FIG. 3 is a cross-sectional view showing such a tunnel diode structure.

Reference numeral 1 shows a p-type region of the α-SiC; 2, an n-type region of the α-SiC; 3, 4, contact electrodes formed on the p- and n-type electrodes; and 5, 6, terminals for applying voltages to the contact electrodes 3, 4. The p-type region 1 and n-type region 2 have a carrier concentration of over $10^{20}$ cm$^{-3}$ each and are doped with impurities of Al and P (or N) to provide a pn-junction diode.

Figure 4:
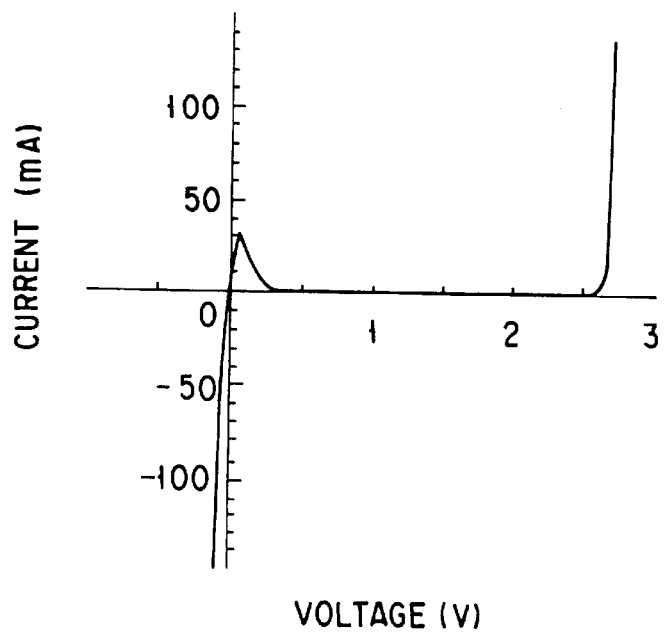
FIG. 4 is a view showing a current/voltage characteristic of the rectifying device according to the embodiment of the present invention.

Here, if a transition between the p-type region and the n-type region is caused to be in precipitous form, the electric field strength of the transition area is made great enough to cause "tunneling" across the bands, so that a tunnel current flows there. The current/voltage characteristic of the SiC tunnel diode is shown in FIG. 4. Since the forbidden band width of the α-SiC is 2.86 eV at 300K, the rise of a current of the diode resulting from a diffusion current becomes prominent unless the forward voltage exceeds 2.5V. In this connection it is to be noted that the forward direction of the diode is toward a direction in which the diffusion current flows.

Figure 5:
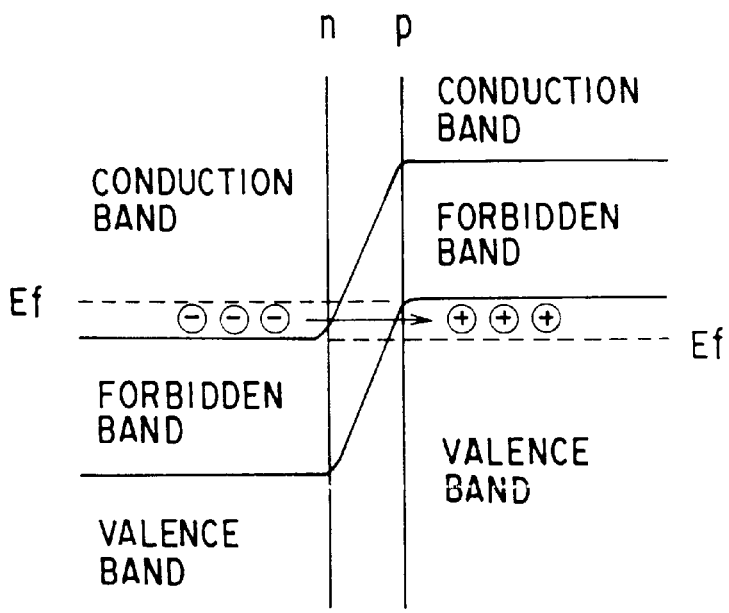
FIG. 5 is a view showing a state of the bands when a tunnel current flows in the rectifying device according to the embodiment of the present invention.

On one hand, the tunnel current flows up to a bias level where there exists a degenerated band overlap between the p-type and n-type (see FIG. 5). Since the effective state density of the conduction band in the SiC is not known in detail, it is not possible to theoretically derive that voltage. However, upon experiment it was found to be about 0.2V. Thus, when a voltage of about 0.2V but below 2.5V is applied in the forward direction, then there is no flow of a current. That is, this range is meant to be between the voltage at a peak value of the tunnel current and the turned-on voltage of the diode.

Figure 6:
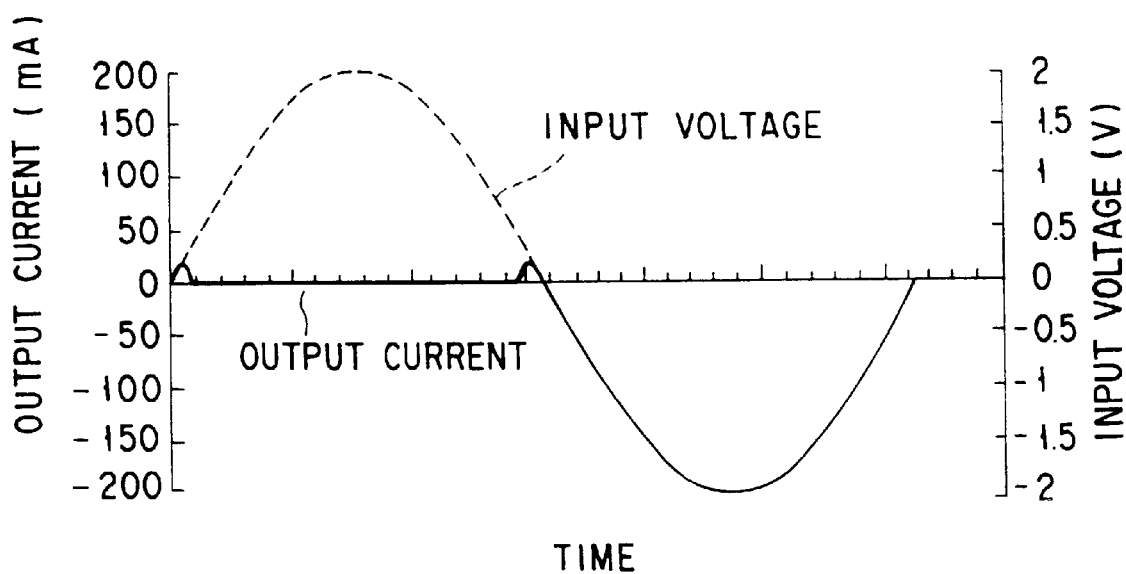
FIG. 6 is a view showing the rectification characteristic of the rectifying device according to the embodiment of the present invention.

In the reverse direction, on the other hand, there is a flow of a tunnel current from a zero volt level. When an AC voltage of a 2V amplitude for instance is applied across the diode, then an output current will be as shown in FIG. 6. When a forward voltage is applied to the diode, there exists an area through which a tunnel current flows. The ratio of its time width per cycle is given by $$\sin^{-1}(V_T/V_P)/\pi$$

where $V_T$: a voltage at which the tunnel current flows, and
$V_P$: a peak level of the application A/C voltage.

For the example of FIG. 6, it is given as a slightly as small as 3%. Since the power loss is proportional to about a square of the voltage, it is given as about 0.1% and a loss by the forward tunnel current can be disregarded. As a result, it is found possible to realize a rectifying device of high efficiency not heretofore achievable in the prior art.

In order to achieve rectification highly efficiently, it is necessary that the diffusion potential be made sufficiently great with respect to the voltage at which the tunnel current flows.

For this reason, it is desirable to raise the diffusion potential with the use of a semiconductor of a greater forbidden band width. Besides the α-SiC, it is also desirable to use a nitride semiconductor, such as gallium nitride (GaN), aluminum nitride (AlN) and indium nitride (InN) or a mixed crystal (for example, AlGaN and InGaN) of at least two selected from the group consisting of these nitride semiconductors as well as a diamond, etc. These materials are used to form p- and n-type regions. For the nitride semiconductor, an impurity, such as Si, is used as an n-type dopant and an impurity, such as Mg, as a p-type dopant. For the diamond, an impurity, such as N, is used as the n-type dopant and an impurity, such as B, is used as the p-type dopant. Although the concentrations of these dopants can be properly set, these concentration levels are typically the same as those of the above-mentioned embodiment.

As already set out above in more detail, according to the present invention, the tunnel diode is formed with the use of the semiconductor of a wide forbidden band width, such as SiC and GaN. A rectifying device for performing a rectifying function is provided by connecting the tunnel diode in a reverse-biased fashion. As a result, it is possible to achieve high-efficiency rectification even at a low-voltage power supply.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

I claim:

1. A rectifying device comprising:
   a pair of terminals across which a predetermined AC voltage is applied; and
   a tunnel diode, connected between the pair of terminals, for performing a rectifying function, wherein a voltage giving a peak value of a tunnel current flowing upon application of a forward bias to the tunnel diode is smaller than a maximum value of the AC voltage, and the tunnel diode includes a semiconductor with a forbidden band width in eV (electron-volt) units which is greater than the maximum value of the AC voltage.

2. The rectifying device according to claim 1, wherein a reverse turn-on voltage of the tunnel diode is zero.

3. The rectifying device according to claim 1, wherein a tunnel current flows when a reverse bias is applied to the tunnel diode and a flow of a current is suppressed when a forward bias is applied to the tunnel diode.

4. The rectifying device according to claim 1, wherein the tunnel diode contains the compound gallium nitride, aluminum nitride and indium nitride, or a mixed crystal of at least two selected from the group constituting of these compounds, or silicon carbide.

5. A rectifying circuit comprising:
   a circuit for supplying a predetermined AC voltage; and
   a tunnel diode for receiving the AC voltage and performing a rectifying function, wherein a voltage giving a peak value of a tunnel current flowing upon application of a forward bias to the tunnel diode is smaller than a maximum value of the AC voltage, and the tunnel diode includes a semiconductor with a forbidden band width in eV (electron-volt) units which is greater than the maximum value of the AC voltage.

6. The rectifying circuit according to claim 5, wherein a reverse turn-on voltage of the tunnel diode is zero.

7. The rectifying circuit according to claim 5, wherein a tunnel current flows when a reverse bias is applied to the tunnel diode and a flow of a current is suppressed when a forward bias is applied to the tunnel diode.

8. The rectifying circuit according to claim 5, wherein the tunnel diode contains the compound gallium nitride, aluminum nitride and indium nitride or a mixed crystal of at least two selected from the group constituting of these compounds, or silicon carbide.

* * * * *